United States Patent
Byeon et al.

(10) Patent No.: US 7,414,890 B2
(45) Date of Patent: Aug. 19, 2008

(54) SEMICONDUCTOR DEVICE INCLUDING A HIGH VOLTAGE GENERATION CIRCUIT AND METHOD OF A GENERATING HIGH VOLTAGE

(75) Inventors: Dae-Seok Byeon, Yongin-si (KR); Young-Ho Lim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/605,227

(22) Filed: Nov. 29, 2006

(65) Prior Publication Data

US 2008/0123417 A1    May 29, 2008

(30) Foreign Application Priority Data

Sep. 25, 2006    (KR) ............... 10-2006-0093029

(51) Int. Cl.
*G11C 16/04* (2006.01)
*G11C 5/14* (2006.01)

(52) U.S. Cl. .............. 365/185.18; 365/189.09; 365/226; 327/536

(58) Field of Classification Search ............ 365/185.18
See application file for complete search history.

(56) References Cited

U.S. PATENT DOCUMENTS

| | | | |
|---|---|---|---|
| 5,767,735 A * | 6/1998 | Javanifard et al. ............ 327/536 |
| 5,774,406 A | 6/1998 | Kowshik | |
| 5,909,140 A | 6/1999 | Choi | |
| 5,969,565 A * | 10/1999 | Naganawa ............... 327/536 |
| 6,151,230 A | 11/2000 | Savelli | |
| 6,154,411 A * | 11/2000 | Morishita ............... 365/226 |
| 6,366,519 B1 | 4/2002 | Hung et al. | |
| 6,912,159 B2 * | 6/2005 | Osawa et al. ........... 365/185.18 |
| 6,992,517 B2 | 1/2006 | Weiner | |
| 7,176,747 B2 * | 2/2007 | Lee et al. ............... 327/536 |
| 7,221,610 B2 * | 5/2007 | Yamazoe et al. ......... 365/226 |
| 7,274,248 B2 * | 9/2007 | Okamoto ............... 327/536 |
| 2002/0008566 A1 * | 1/2002 | Taito et al. ............. 327/536 |

FOREIGN PATENT DOCUMENTS

JP    2005-080395    3/2005

* cited by examiner

*Primary Examiner*—Son L Mai
(74) *Attorney, Agent, or Firm*—Volentine & Whitt, PLLC

(57) ABSTRACT

A semiconductor memory device comprises a first pump clock generator configured to generate a first pump clock signal based on a first power supply voltage. The device also comprises a first charge pump configured to generate a first pump output voltage in response to the first pump clock signal. The device also comprises a second pump clock generator configured to generate a second pump clock signal based on the first pump output voltage. The device also comprises a second charge pump configured to generate a second pump output voltage in response to the second pump clock signal. The device also comprises a third pump clock generator configured to generate a third pump clock signal based on the first power supply voltage. The device also comprises a third charge pump configured to generate a third pump output voltage in response to the third pump clock signal.

13 Claims, 6 Drawing Sheets

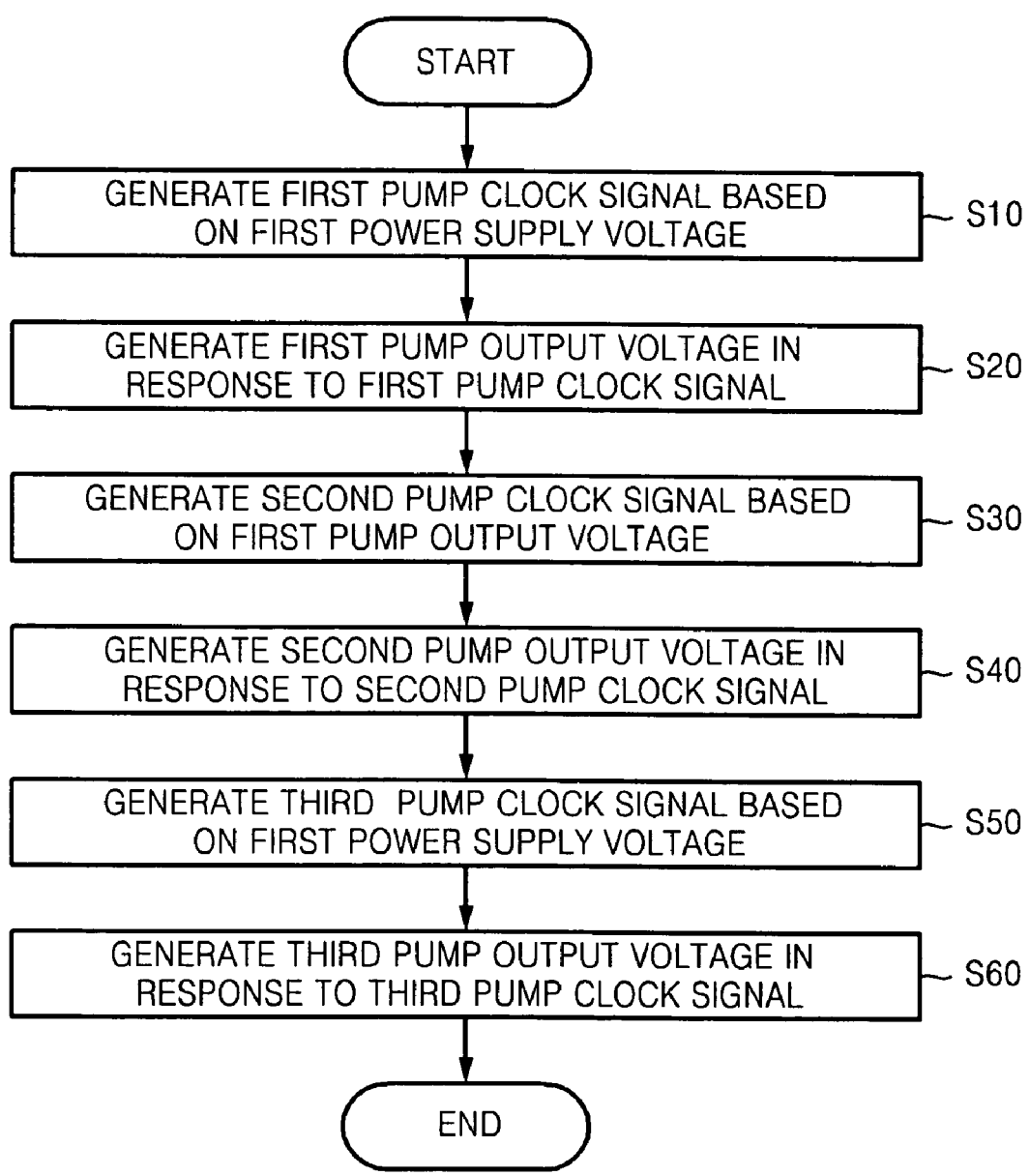

US 7,414,890 B2

SEMICONDUCTOR DEVICE INCLUDING A HIGH VOLTAGE GENERATION CIRCUIT AND METHOD OF A GENERATING HIGH VOLTAGE

BACKGROUND OF THE INVENTION

1. Field of the Invention

The present invention relates generally to a semiconductor device and, more particularly, to a semiconductor device including a high voltage generation circuit and a method of generating a high voltage.

This application claims the benefit of Korean Patent Application No. 10-2006-0093029, filed on Sep. 25, 2006, in the Korean Intellectual Property Office, the disclosure of which is incorporated herein in its entirety by reference.

2. Background of the Invention

A flash memory device is considered a non-volatile memory device in that it retains data stored when power to the device is turned off or otherwise interrupted. While many types of semiconductor memory devices utilize a single power supply unit, a flash memory device typically requires the generation of multiple internal voltage levels in order to drive different types of circuits included within the device.

For example, a program voltage for programming data in a flash memory cell and an erase voltage for erasing data from the flash memory cell are generally higher than a power supply voltage (e.g., 20V). In addition, a voltage of about 5-8 V may be needed during a read operation.

In order to obtain these voltages, the flash memory device generally includes a high voltage generation circuit. Specifically, the high voltage generation circuit generates a constant voltage. The high voltage generation circuit may be referred to as a regulator circuit and is usually implemented using a charge pump. The high voltage generation circuit may also be used to generate voltages having different levels. This may be achieved, for example, by receiving a single power such as a first power supply voltage and generating different power supply voltages having different voltage levels using the voltage regulator circuit.

Specifically, a semiconductor device receives a single power supply voltage such as, for example, a first power supply voltage, and generates different power supply voltages having different levels using at least one regulator circuit. Furthermore, regulator circuits usually control the increase and decrease of an output voltage using a resistor divider. Moreover, a current path for the resistor divider is controlled by a switch. For example, the switch is connected in parallel with the resistor divider and is turned on/off in response to a switching voltage generated by a high voltage generator and a switch enable signal. In addition, the switching voltage is also used as a power supply voltage for driving at least one circuit included in a semiconductor device.

However, under some circumstances, the switching voltage may not reach a target level. When this happens, the switching voltage may not allow the switch to be normally turned on/off. This malfunctioning of the switch may cause the output voltage of the regulator circuit to become unstable. Furthermore, this instability of the output voltage of the regulator circuit may cause the output voltage to increase rapidly resulting in an overshoot of the voltage.

In particular, flash memory devices decrease the switching voltage during a read operation, which is performed to verify data that has been programmed in a cell. This decrease in the switching voltage may be performed in order to prevent a parasitic effect from occurring during the read operation. However, when the switching voltage is decreased, the regulator circuit may operate erroneously due to the change in the switching voltage, and, as described above, this erroneous operation of the regulator circuit may cause the output voltage to increase rapidly resulting in an overshoot of the voltage.

SUMMARY OF THE INVENTION

One aspect of the present disclosure includes a semiconductor device. The device comprises a first pump clock generator configured to generate a first pump clock signal based on a first power supply voltage. The device also comprises a first charge pump configured to generate a first pump output voltage in response to the first pump clock signal. The device also comprises a second pump clock generator configured to generate a second pump clock signal based on the first pump output voltage. The device also comprises a second charge pump configured to generate a second pump output voltage in response to the second pump clock signal. The device also comprises a third pump clock generator configured to generate a third pump clock signal based on the first power supply voltage. The device also comprises a third charge pump configured to generate a third pump output voltage in response to the third pump clock signal.

Another aspect of the present disclosure includes a method of generating a voltage in a semiconductor device. The method comprises generating a first pump clock signal based on a first power supply voltage. The method also comprises generating a first pump output voltage in response to the first pump clock signal. The method also comprises generating a second pump clock signal based on the first pump output voltage. The method also comprises generating a second pump output voltage in response to the second pump clock signal. The method also comprises generating a third pump clock signal based on the first power supply voltage. The method also comprises generating a third pump output voltage in response to the third pump clock signal.

BRIEF DESCRIPTION OF THE DRAWINGS

The above and other features of the present invention will become readily apparent from the detailed description that follows, with reference to the accompanying drawings, in which:

FIG. 7 is a flowchart of a method of generating a voltage in a semiconductor device according to an exemplary disclosed embodiment.

DETAILED DESCRIPTION OF EMBODIMENTS

Figure 1A:
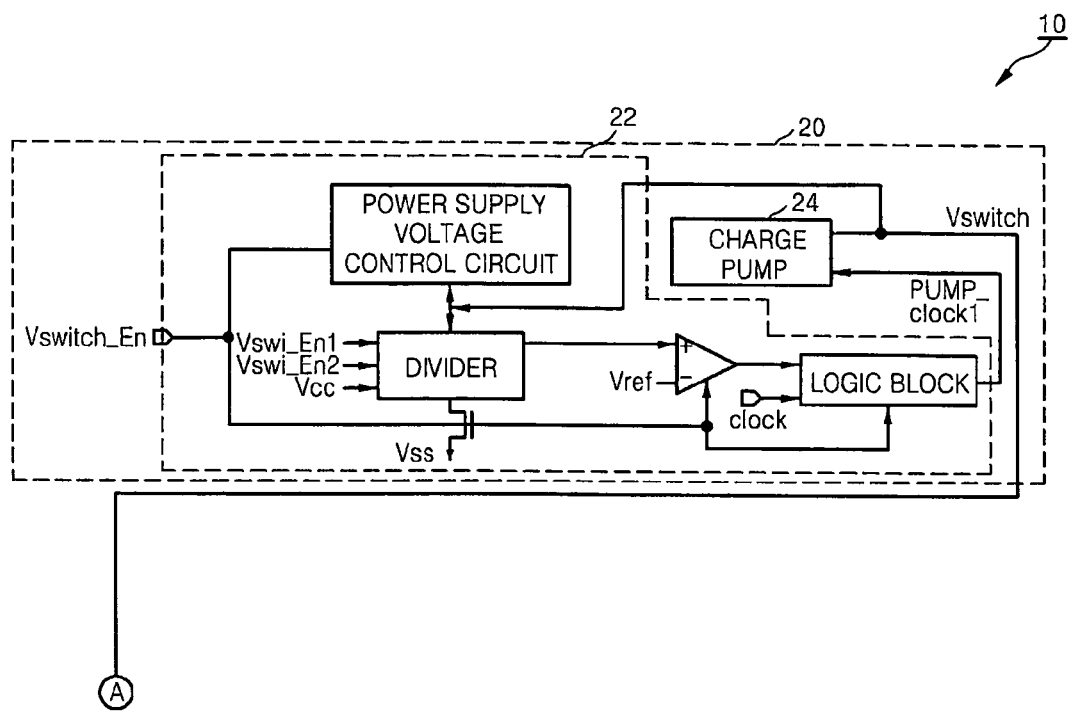
FIGS. 1A and 1B are block diagrams of a semiconductor device according to an exemplary disclosed embodiment.

The present disclosure will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1B:
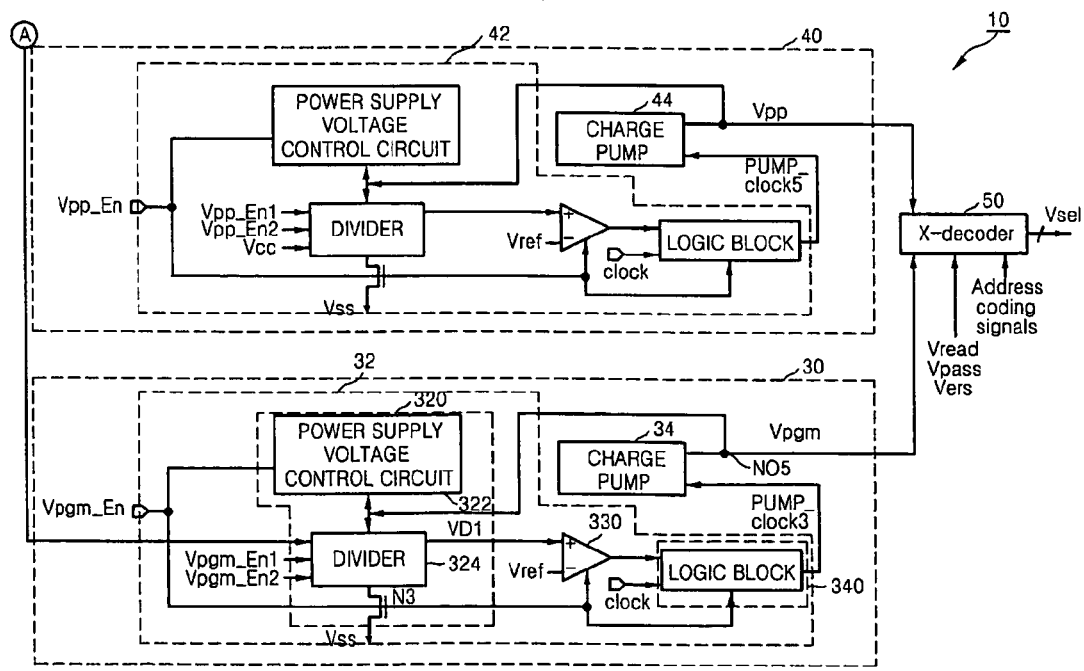

FIGS. 1A and 1B are block diagrams of a semiconductor device 10 according to an exemplary disclosed embodiment. Referring to FIGS. 1A and 1B, the semiconductor device 10 includes a first voltage generation unit 20, a second voltage generation unit 30, a third voltage generation unit 40, and a row decoder circuit (i.e., an X-decoder) 50.

The first voltage generation unit 20 generates a first pump output voltage Vswitch based on a first voltage generation enable signal Vswitch_En and a first power supply voltage Vcc. To this end, the first voltage generation may include a number of components. These components may include, for example, a first pump clock generator 22 and a first charge pump 24.

The first pump clock generator 22 generates a first pump clock signal PUMP_clock1 for controlling the operation of the first charge pump 24 in response to the first voltage generation enable signal Vswitch_En. Furthermore, the first charge pump 24 performs a pumping operation in response to the first pump clock signal PUMP_clock1 and generates the first pump output voltage Vswitch.

The second voltage generation unit 30 generates a second pump output voltage Vpgm based on a second voltage generation enable signal Vpgm_En and the first pump output voltage Vswitch. Similar to the first voltage generation unit 20, the second voltage generation unit 30 also includes a second pump clock generator 32 and a second charge pump 34.

The second pump clock generator 32 generates a second pump clock signal PUMP_clock3 for controlling the operation of the second charge pump 34 based on the first pump output voltage Vswitch. Furthermore, the second charge pump 34 performs a pumping operation in response to the second pump clock signal PUMP_clock3 and generates the second pump output voltage Vpgm.

In order to stop the operation of the second pump clock generator 32 when the second pump output voltage Vpgm output from the second charge pump 34 reaches a predetermined target level, the second pump clock generator 32 is connected with an output node NO5 of the second charge pump 34. This feedback connection between the second pump clock generator 32 and the second charge pump 34 allows the second pump clock generator 32 to stop generating the second pump clock signal PUMP_clock3 when a voltage of the output node NO5 or a voltage obtained by dividing the voltage of the output node NO5 is higher than a reference voltage Vref.

The voltage of the output node NO5 varies based on the operation of the second charge pump 34. Specifically, while the second charge pump 34 is enabled, the voltage of the output node NO5 is the second pump output voltage Vpgm. However, when the second pump clock signal PUMP_clock3 is interrupted, the second charge pump 34 is disabled and the voltage of the output node NO5 is biased to the first power supply voltage Vcc by a power supply voltage control circuit 322.

The third voltage generation unit 40 generates a third pump output voltage Vpp based on a third voltage generation enable signal Vpp_En and the first power supply voltage Vcc. Similar to the first voltage generation circuit 20 and the second voltage generation circuit 30, the third voltage generation unit 40 includes a third pump clock generator 42 and a third charge pump 44.

The third pump clock generator 42 generates a third pump clock signal PUMP_clock5 based on the first power supply voltage Vcc. In addition, the third charge pump 44 generates the third pump output voltage Vpp in response to the third pump clock signal PUMP_clock5.

Figure 3:
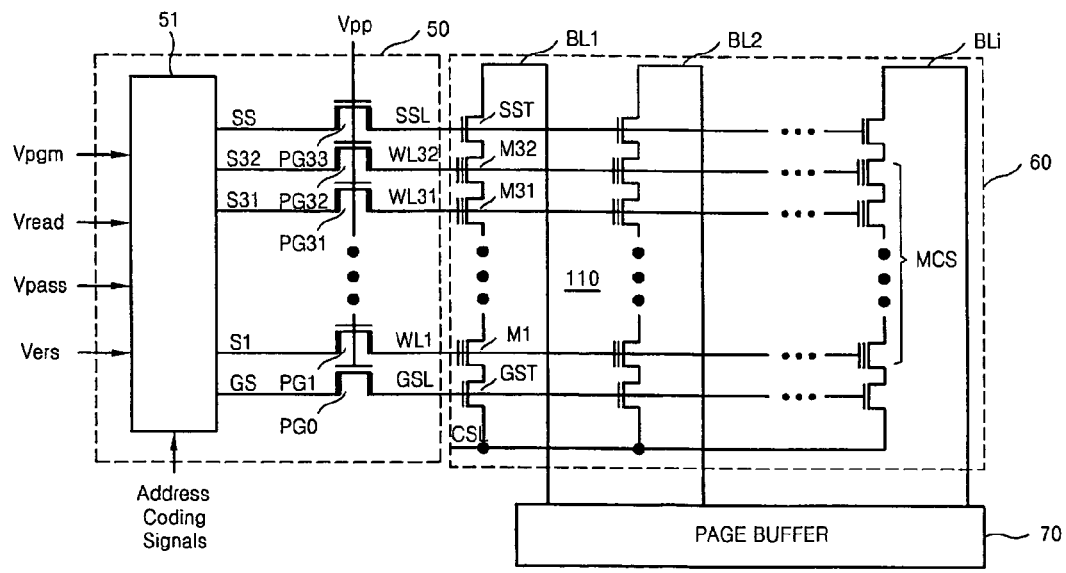
FIG. 3 illustrates a row decoder and a memory cell array included in a semiconductor device according to an exemplary disclosed embodiment.

The row decoder circuit 50 is connected with a memory cell array (60 in FIG. 3). Furthermore, the row decoder circuit 50 outputs at least one row line selection voltage Vsel based on one or more address signals (for example, address coding signals,) and the second pump output voltage Vpgm or the third pump output voltage Vpp. This operation will be described in detail with reference to FIG. 3 later. The row line selection voltage Vsel may be a read voltage Vread, a pass voltage Vpass, or an erase voltage Vers. In an exemplary embodiment, the read voltage Vread, the pass voltage Vpass, and the erase voltage Vers may be generated by a circuit having a structure which is the same as or similar to that of the voltage generation units 20, 30 and 40 illustrated in FIGS. 1A and 1B.

Figure 2:
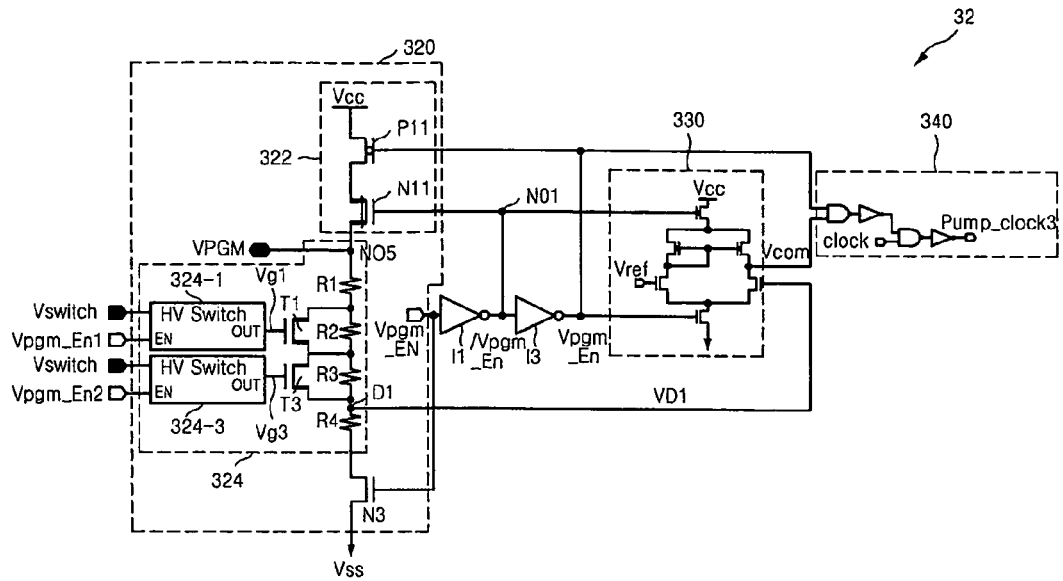
FIG. 2 is a circuit diagram of a pump clock generator illustrated in FIGS. 1A and 1B.

FIG. 2 is a circuit diagram of the second pump clock generator 32 illustrated in FIGS. 1A and 1B. Referring to FIGS. 1A through 2, the second pump clock generator 32 includes a divided voltage output block 320, a comparator 330, and a logic block 340. The divided voltage output block 320 is connected with the second charge pump 34 and outputs the first power supply voltage Vcc and the second pump output voltage Vpgm or outputs a voltage obtained by dividing the second pump output voltage Vpgm. In an exemplary embodiment, the divided voltage output block 320 includes a power supply voltage control circuit 322, a divider 324, and a switch N3.

The power supply voltage control circuit 322 biases the voltage of the output node N05, i.e., the second pump output voltage Vpgm output from the second charge pump 34, to a level of the first power supply voltage Vcc when the second voltage generation enable signal Vpgm_En is deactivated. For example, when the second voltage generation enable signal Vpgm_En is deactivated to a low level of "0", the power supply voltage control circuit 322 operates such that the output node NO5 is at the level of the first power supply voltage Vcc. In an exemplary embodiment, the power supply voltage control circuit 322 includes a PMOS transistor P11 and a depletion transistor N11.

The PMOS transistor P11 and the depletion transistor N11 are respectively turned on/off in response to the second voltage generation enable signal Vpgm_En and an inverted second voltage generation enable signal /Vpgm_En which are respectively input through a second inverter I3 and a first inverter I1. More particularly, when the second voltage generation enable signal Vpgm_En is activated, both of the PMOS transistor P11 and the depletion transistor N11 are turned off and the output node NO5 is isolated from a node of the first power supply voltage Vcc. On the other hand, when the second voltage generation enable signal Vpgm_En is deactivated, both of the PMOS transistor P11 and the depletion transistor N11 are turned on and the output node NO5 is electrically connected with the node of the first power supply voltage Vcc. As a result, the output node NO5 is biased to the level of the first power supply voltage Vcc.

The divider 324 divides the second pump output voltage Vpgm based on the first pump output voltage Vswitch and at least one of first and second division control signals Vpgm_En1 and Vpgm_En2, respectively, and outputs a divided voltage. Specifically, the first division control signal Vpgm_En1 activates a first switch T1 of the divider 324 and the second division control signal Vpgm_En2 activates a second switch T3 of the divider 324. The first and second division control signals Vpgm_En1 and Vpgm_En2 may be generated by a controller (not shown) included in the semiconductor device 10.

In an exemplary embodiment, the divider 324 includes a first switch controller 324-1 (also known as a high voltage switch), the first switch T1, a second switch controller 324-3 (also known as a high voltage switch), the second switch T3, and first through fourth resistors R1 through R4 connected in series. Furthermore, each of the first and second switches T1 and T3 is connected in parallel with at least one of the first through fourth resistors R1 through R4. In addition, in an exemplary embodiment, switches T1 and T3 may be implemented by a transistor.

The first switch controller 324-1 outputs a first switch control voltage Vg1 based on the first pump output voltage Vswitch and the first division control signal Vpgm_En1. For example, when the first division control signal Vpgm_En1 is activated to a high level of "1", the first switch control voltage Vg1 has a level of the first pump output voltage Vswitch and thus turns on the first switch T1. As a result, current flows to the first switch T1 instead of the second resistor R2. Because current flow to the second resistor R2 is blocked, the second resistor R2 is disabled. However, when the first division control signal Vpgm_En1 is deactivated to the low level of "0", the first switch control voltage Vg1 has a level of a second power supply voltage Vss and thus turns off the first switch T1. As a result, current flows to the second resistor R2, which is enabled.

The second switch controller 324-3 outputs a second switch control voltage Vg3 based on the first pump output voltage Vswitch and the second division control signal Vpgm_En2. For example, when the second division control signal Vpgm_En2 is activated to a high level of "1", the second switch control voltage Vg3 has the level of the first pump output voltage Vswitch and thus turns on the second switch T3. As a result, current flow to the third resistor R3 is blocked and the third resistor R3 is disabled. However, when the second division control signal Vpgm_En2 is deactivated to the low level of "0", the second switch control voltage Vg3 has the level of the second power supply voltage Vss and thus turns off the second switch T3. As a result, current flows into the third resistor R3, which is enabled.

In other words, in a case where the first through fourth resistors R1 through R4 are connected in series between an output node NO5 of the second charge pump 34 and the second power supply voltage Vss, the second pump output voltage Vpgm is divided by the on/off operation of the first and second switches T1 and T3.

Furthermore, the switch N3 is turned on or off in response to the second voltage generation enable signal Vpgm_En so as to selectively form an electrical path between the output node NO5 of the second charge pump 34 and the second power supply voltage Vss.

The comparator 330 compares an output voltage, i.e., a divided voltage VD1 output from the divided voltage output block 320, with the reference voltage Vref and generates a comparison signal Vcom. For example, when the divided voltage VD1 is higher than the reference voltage Vref, the comparison signal Vcom is output at the low level of "0". On the other hand, when the divided voltage VD1 is lower than the reference voltage Vref, the comparison signal Vcom is output at the high level of "1".

The logic block 340 generates the second pump clock signal PUMP_clock3 having a predetermined cycle in response to the second voltage generation enable signal Vpgm_En, the comparison signal Vcom, and a clock signal "clock". In an exemplary embodiment, the logic block 340 performs an AND operation on the second voltage generation enable signal Vpgm_En and the comparison signal Vcom and then performs another AND operation on a result of the AND operation and the clock signal "clock", thereby generating the second pump clock signal PUMP_clock3.

For example, when the second voltage generation enable signal Vpgm_En is activated to the high level of "1" and when the comparison signal Vcom is provided at the high level of "1", that is, the divided voltage VD1 is lower than the reference voltage, the clock signal "clock" is output as the second pump clock signal PUMP_clock3. Then, the second charge pump 34 performs charge pumping in response to the second pump clock signal PUMP_clock3 and boosts the second pump output voltage Vpgm to the level of the reference voltage Vref. However, when second voltage generation enable signal Vpgm_En is deactivated or when the comparison signal Vcom is provided at the low level of "0", that is, the divided voltage VD1 is higher than the reference voltage, the second pump clock signal PUMP_clock3 remains at the low level of "0". Then, the second charge pump 34 stops charge pumping so that the second pump output voltage Vpgm is maintained at the level of the reference voltage or decreased.

The structure and the operation of the first pump clock generator 22 illustrated in FIGS. 1A and 1B is the same as or is similar to that of the second pump clock generator 32, with the exception that the first pump clock generator 22 operates in response to the first voltage generation enable signal Vswitch_En, the first power supply voltage Vcc, a third division control signal Vswi_En1, and a fourth division control signal Vswi_En2 instead of the second voltage generation enable signal Vpgm_En, the first pump output voltage Vswitch, the first division control signal Vpgm_En1, and the second division control signal Vpgm_En2. Therefore, a detailed description of the first pump clock generator 22 will be omitted.

Similarly, the structure and the operation of the third pump clock generator 42 illustrated in FIGS. 1A and 1B is the same as or is similar to that of the second pump clock generator 32, with the exception that the third pump clock generator 42 operates in response to the third voltage generation enable signal Vpp_En, the first power supply voltage Vcc, a fifth division control signal Vpp_En1, and a sixth division control signal Vpp_En2 instead of the second voltage generation enable signal Vpgm_En, the first pump output voltage Vswitch, the first division control signal Vpgm_En1, and the second division control signal Vpgm_En2. Therefore, a detailed description of the third pump clock generator 42 will be omitted.

FIG. 3 illustrates the row decoder circuit 50 and a memory cell array 60 included in a semiconductor device according to an exemplary disclosed embodiment. Specifically, the semiconductor device illustrated in FIG. 3 is an example of a flash memory device.

Referring to FIG. 3, the memory cell array 60 may be connected with the row decoder circuit 50 through a plurality of row lines SSL, WL32 through WL1, and GSL. In addition, the memory cell array 60 may also be connected with a page buffer 70 through a plurality of bit lines BL1, BL2, ..., BLi.

The row decoder circuit 50 receives the second and third pump output voltages Vpgm and Vpp, respectively, the read voltage Vread, the pass voltage Vpass, the erase voltage Vers, and the address coding signals. Furthermore, based on the address coding signals, the row decoder circuit 50 outputs the second pump output voltage Vpgm (e.g., a program voltage), the read voltage Vread, the pass voltage Vpass, or the erase voltage Vers, to one of the row lines SSL, WL32 through WL1, and GSL. To this end, the row decoder circuit 50 may include a row line voltage selector 51 and a plurality of transistors PG0 through PG33.

The row line voltage selector 51 selects and outputs row line selection voltages SS, S32, S31, ..., S1, and GS, which will be applied to the row lines SSL, WL32 through WL1, and GSL, respectively, using a plurality of generated voltages. These generated voltages may include, for example, the second pump output voltage Vpgm, the read voltage Vread, the pass voltage Vpass, and the erase voltage Vers. In addition, the plurality of the transistors PG0 through PG33 are turned on/off in response to the third pump output voltage Vpp so that the row line selection voltages SS, S32 through S1, and GS are respectively output to the row lines SSL, WL32 through WL1, and GSL.

The memory cell array 60 includes a plurality of the bit lines BL1 through BLi and memory cell strings MCS respectively connected with the bit lines BL1 through BLi. Furthermore, each of the memory cell strings MCS includes a plurality of (e.g., 32) cell transistors M1 through M32, which are connected in series between a source of a string selection transistor SST and a drain of a ground selection transistor GST. Moreover, a drain of each of string selection transistors SST is connected with a corresponding bit line BLj (where j=1 through i) and a source of each of ground selection transistors GST is connected with a common source line CSL. In addition, gates of the string selection transistors SST are connected with the string selection line SSL in common and gates of the ground selection transistors GST are connected with the ground selection line GSL in common. Also, control gates of the cell transistors M1 in the memory cell strings MCS are connected with the word line WL1 in common. In the same manner, control gates of the other cell transistors M2 through M32 in the memory cell strings MCS are connected with the word lines WL2 through WL32, respectively, in common. The row lines, i.e., the string selection line SSL, the word lines WL32 through WL1, and the ground selection line GSL within the memory cell array 60 respectively receive the row line selection voltages SS, S32 through S1, and GS through the transistors PG33 through PG1, which are turned on/off in response to the third pump output voltage Vpp.

Figure 4:
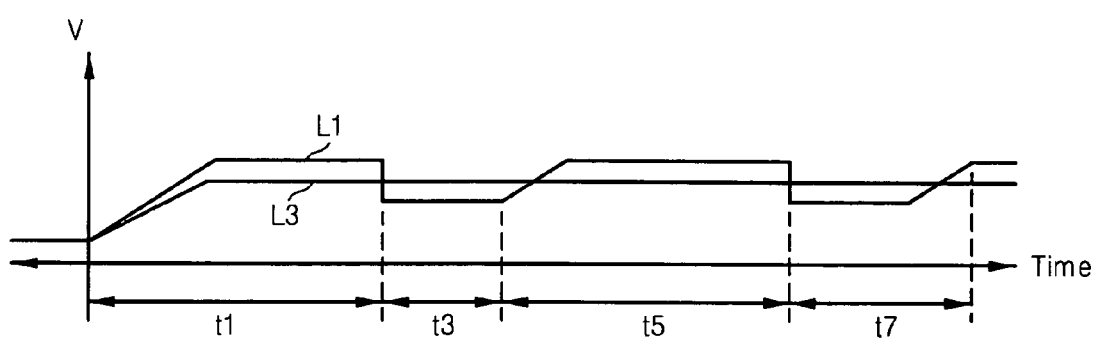
FIG. 4 is a graph illustrating the levels of an output voltage in the semiconductor device illustrated in FIGS. 1A and 1B.

FIG. 4 is a graph illustrating the levels of an output voltage in the semiconductor device illustrated in FIGS. 1A and 1B. Referring to FIGS. 1A, 1B, and 4, while the memory cell array is being programmed, that is, during a programming period t1 or t5, a level L1 of the third pump output voltage Vpp is higher than a level L3 of the second pump output voltage Vpgm. In contrast, during a reading period t3 or t7 in which data programmed in a cell in the memory cell array is verified, the level L1 of the third pump output voltage Vpp is lower than the level L3 of the second pump output voltage Vpgm. In other words, during the data verification periods t3 and t7, the third pump output voltage Vpp applied to the row decoder circuit 50 is maintained at a low level, and therefore, a parasitic effect that may occur due to the third pump output voltage Vpp is prevented. Because of the low or lack of parasitic effect, data verification may be performed stably.

In an exemplary embodiment, the second voltage generation unit 30 uses the first pump output voltage Vswitch generated by the first voltage generation unit 20 as an input voltage of the switch controllers 324-1 and 324-3. Furthermore, the first pump output voltage Vswitch may be higher than or equal to the second pump output voltage Vpgm during the programming periods t1 and t5 and also during the reading periods t3 and t7 for data verification. Accordingly, even if the third pump output voltage Vpp is lower than the second pump output voltage Vpgm during the reading periods t3 and t7, the second pump output voltage Vpgm can be stably generated without overshoot regardless of the third pump output voltage Vpp. In other words, the level L3 of the second pump output voltage Vpgm generated by the second voltage generation unit 30 is not affected by the level L1 of the third pump output voltage Vpp generated by the third voltage generation unit 40 and overshoot of the second pump output voltage Vpgm may be prevented.

Figure 5:
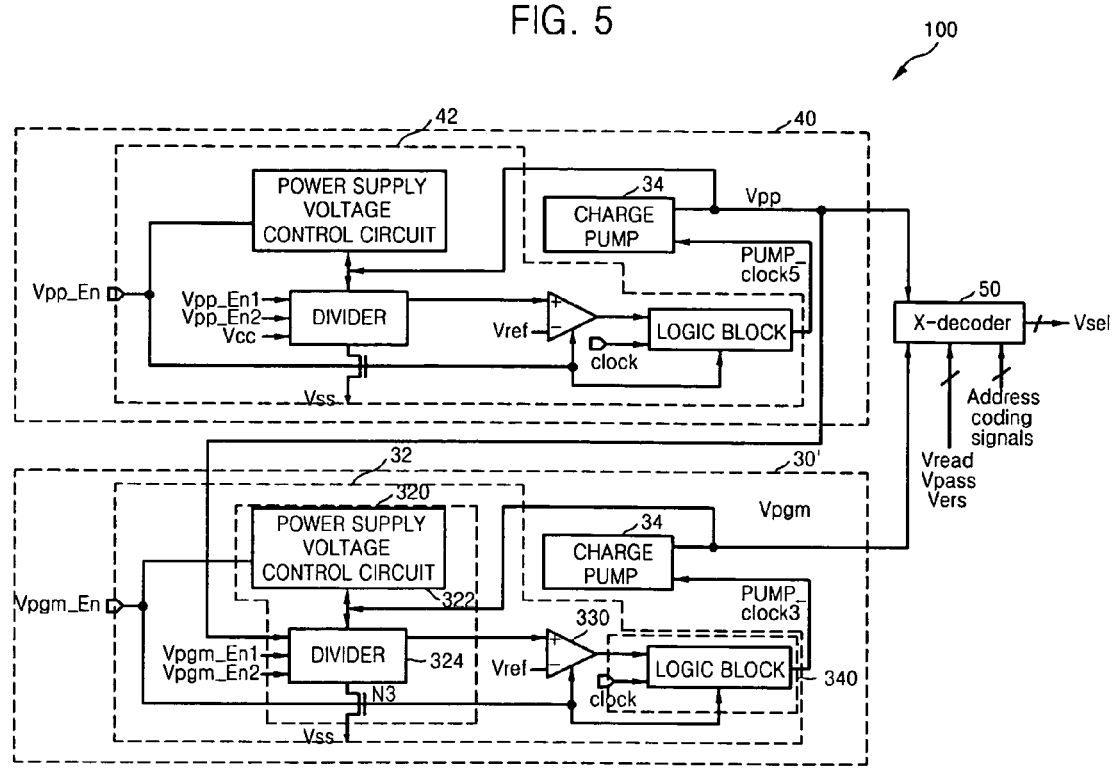
FIG. 5 is a block diagram of a semiconductor device illustrated to compare the semiconductor device with exemplary disclosed embodiments.
Figure 6:
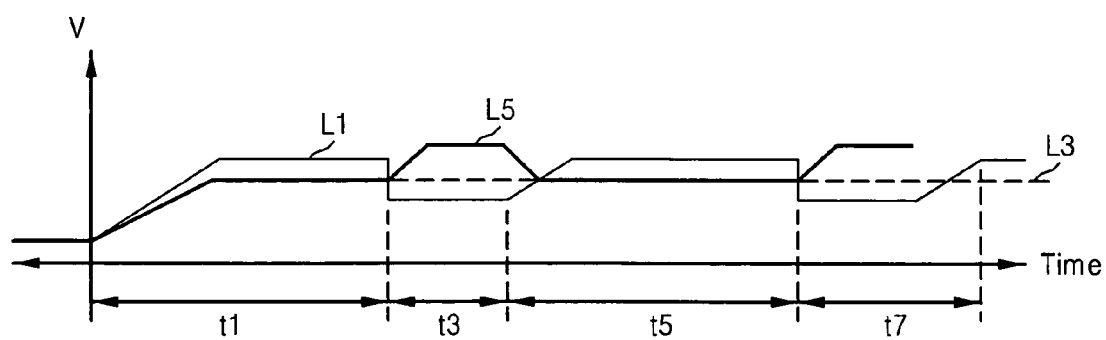
FIG. 6 is a graph illustrating the levels of an output voltage in the semiconductor device illustrated in FIG. 5.

FIG. 5 is a block diagram of a semiconductor device 100 and is provided to compare the device 100 with exemplary disclosed embodiments. Furthermore, FIG. 6 is a graph illustrating the levels of an output voltage in the semiconductor device 100 illustrated in FIG. 5. Referring to FIGS. 1A through 6, the structure and the operation of the semiconductor device 100 illustrated in FIG. 5 is the same as or similar to that of the semiconductor device 10 illustrated in FIGS. 1A and 1B, with the exception that the semiconductor device 100 does not include the first voltage generation unit 20. Furthermore, a second voltage generation unit 30' operates in response to the third pump output voltage Vpp generated by the third voltage generation unit 40 instead of the first pump output voltage Vswitch generated by the first voltage generation unit 20 of FIG. 1A.

Referring to FIG. 6, during the program periods t1 and t5 of a memory cell array (not shown) included in the semiconductor device 100, the level L1 of the third pump output voltage Vpp is higher than the level L3 of the second pump output voltage Vpgm. On the other hand, during the reading periods t3 and t7 in which data programmed in a cell in the memory cell array is verified, the level L1 of the third pump output voltage Vpp is lower than the level L3 of the second pump output voltage Vpgm. In other words, during the data verification periods t3 and t7, the third pump output voltage Vpp applied to the row decoder circuit 50 is maintained at a low level to prevent a parasitic effect that may occur due to the third pump output voltage Vpp. However, during the data verification periods t3 and t7, due to an abnormal operation of the second voltage generation unit 30' caused by the instability of the third pump output voltage Vpp input to the switch controllers 324-1 and 324-3, the second pump output voltage Vpgm may suddenly increase to a level L5 higher than a target voltage level, i.e., L3, which results in an overshoot. As a result, data verification may be unreliable.

However, in an exemplary embodiment, the second voltage generation unit 30 included in the semiconductor device 10 outputs the second pump output voltage Vpgm based on the first pump output voltage Vswitch generated by the first voltage generation unit 20. Accordingly, the second voltage generation unit 30 uses the first pump output voltage Vswitch as an input voltage of the switch controllers 324-1 and 324-3 so that the second voltage generation unit 30 is not affected by the third pump output voltage Vpp even when the third pump output voltage Vpp becomes low or unstable. In other words, the second pump output voltage Vpgm generated by the second voltage generation unit 30 is maintained at the level L3 regardless of the level L1 of the third pump output voltage Vpp generated by the third voltage generation unit 40. This independence of the level L3 of the second pump output voltage Vpgm from the level L1 of the third pump output voltage Vpp may prevent the overshoot of the second pump output voltage Vpgm In addition, the first pump output voltage Vswitch generated by the first voltage generation unit 20 may be exclusively used as an input voltage of the second voltage generation unit 30 and may also be used as a switching voltage for other voltage generation units (not shown).

FIG. 7 is a flowchart of a method of generating a voltage in an exemplary disclosed semiconductor device. Referring to FIGS. 1A and 1B and FIG. 7, at step S10, the first pump clock generator 22 generates the first pump clock signal PUMP_clock1 based on the first power supply voltage Vcc. At step S20, the first charge pump 24 generates the first pump output voltage Vswitch in response to the first pump clock signal PUMP_clock1. At step S30, the second pump clock generator 32 generates the second pump clock signal PUMP_clock3 based on the first pump output voltage Vswitch. At step S40, the second charge pump 34 generates the second pump output voltage Vpgm in response to the second pump clock signal PUMP_clock3. At step S50, the third pump clock generator 42 generates the third pump clock signal PUMP_clock5 based on the first power supply voltage Vcc. At step S60, the third charge pump 44 generates the third pump output voltage Vpp in response to the third pump clock signal PUMP_clock5.

The disclosed voltage generation system and method for generating a voltage may be used in any semiconductor memory device. As described above, because the second pump clock generator 32 generates the second pump clock signal PUMP_clock3 based on the first pump output voltage Vswitch, the second pump output voltage Vpgm may be generated stably without overshoot even if the third pump output voltage Vpp becomes low or unstable.

While the disclosed system has been shown and described with reference to exemplary embodiments thereof, it will be understood by those of ordinary skill in the art that various changes in form and detail may be made herein without departing from the spirit and scope of the present invention, as defined by the following claims.

What is claimed is:

1. A semiconductor device comprising:
   a first pump clock generator configured to generate a first pump clock signal based on a first power supply voltage;
   a first charge pump configured to generate a first pump output voltage in response to the first pump clock signal;
   a second pump clock generator configured to generate a second pump clock signal based on the first pump output voltage;
   a second charge pump configured to generate a second pump output voltage in response to the second pump clock signal;
   a third pump clock generator configured to generate a third pump clock signal based on the first power supply voltage; and
   a third charge pump configured to generate a third pump output voltage in response to the third pump clock signal.

2. The semiconductor device of claim 1, wherein the second pump clock generator comprises:
   a divided voltage output block configured to output the first power supply voltage, the second pump output voltage or a voltage obtained by dividing the second pump output voltage;
   a comparator configured to compare an output voltage of the divided voltage output block with a reference voltage and to generate a comparison signal based on the comparison; and
   a logic block configured to generate the second pump clock signal having a predetermined cycle based on an enable signal and the comparison signal.

3. The semiconductor device of claim 2, wherein the divided voltage output block comprises:
   a divider configured to divide the second pump output voltage based on the first pump output voltage and a division control signal and output a divided voltage; and
   a switch configured to selectively form a current path between an output node of the second charge pump and a second power supply voltage in response to the enable signal.

4. The semiconductor device of claim 3, wherein the divider comprises:
   a high voltage switch configured to receive the first pump output voltage and to output an output voltage in response to the division control signal;
   at least one resistor connected in series between the output node of the second charge pump and a terminal of the switch; and
   a transistor connected in parallel with the at least one resistor, the transistor being configured to be turned on or off in response to the output voltage of the high voltage switch.

5. The semiconductor device of claim 3, further comprising a power supply voltage control circuit configured to bias a voltage of the output node of the second charge pump to a level of the first power supply voltage when the enable signal is deactivated.

6. The semiconductor device of claim 1, further comprising a row decoder circuit connected with a memory cell array in the semiconductor device through a plurality of row lines, the row decoder circuit being configured to receive the second pump output voltage, the third pump output voltage, and address signals, and to output the second pump output voltage to at least one row line based on the address signals.

7. The semiconductor device of claim 6, wherein the semiconductor device is a flash memory device, and wherein the second pump output voltage is a program voltage used to write data into at least one memory cell in the memory cell array or an erase voltage used to erase the data from the at least one memory cell.

8. The semiconductor device of claim 7, wherein the third pump output voltage is higher than the second pump output voltage during a programming period of the flash memory device and is lower than the second pump output voltage during a reading period for verification of programmed data in the flash memory device, and wherein the first pump output voltage is higher than or equal to the second pump output voltage during the programming period and the reading period of the flash memory device.

9. The semiconductor device of claim 6, wherein the row decoder circuit comprises a transistor which is turned on based on the third pump output voltage to output the second pump output voltage to the at least one row line.

10. The semiconductor device of claim 7, wherein the second pump clock generator comprises:

a divided voltage output block configured to output the first power supply voltage, the second pump output voltage or a voltage obtained by dividing the second pump output voltage;

a comparator configured to compare an output voltage of the divided voltage output block with a reference voltage and to generate a comparison signal based on the comparison; and a logic block configured to generate the second pump clock signal having a predetermined cycle in response to an enable signal which is used to generate the second pump output voltage, and the comparison signal.

11. A method of generating a voltage in a semiconductor device, the method comprising:

generating a first pump clock signal based on a first power supply voltage;

generating a first pump output voltage in response to the first pump clock signal;

generating a second pump clock signal based on the first pump output voltage;

generating a second pump output voltage in response to the second pump clock signal;

generating a third pump clock signal based on the first power supply voltage; and generating a third pump output voltage in response to the third pump clock signal.

12. The method of claim 11, wherein generating the second pump clock comprises:

outputting the first power supply voltage, the second pump output voltage, or a divided voltage obtained by dividing the second pump output voltage;

comparing the divided voltage with a reference voltage and generating a comparison signal; and generating the second pump clock signal having a predetermined cycle in response to an enable signal which is used to generate the second pump output voltage, and the comparison signal.

13. The method of claim 12, wherein outputting the divided voltage comprises:

dividing the second pump output voltage based on the first pump output voltage and outputting the divided voltage when the enable signal is activated; and connecting an output node which outputs the second pump output voltage and a second power supply voltage in response to the enable signal.

* * * * *